US 8,547,177 B1

(12) United States Patent
Yoo et al.

(10) Patent No.: US 8,547,177 B1
(45) Date of Patent: Oct. 1, 2013

(54) ALL-DIGITAL SWITCHED-CAPACITOR RADIO FREQUENCY POWER AMPLIFICATION

(75) Inventors: Sangmin Yoo, Seattle, WA (US); David Allstot, Seattle, WA (US); Jeffrey Walling, Highland Park, NJ (US)

(73) Assignee: University of Washington through its Center For Commercialization, Seattle, WA (US)

( * ) Notice: Subject to any disclaimer, the term of this patent is extended or adjusted under 35 U.S.C. 154(b) by 0 days.

(21) Appl. No.: 13/106,739

(22) Filed: May 12, 2011

Related U.S. Application Data

(60) Provisional application No. 61/334,027, filed on May 12, 2010, provisional application No. 61/432,856, filed on Jan. 14, 2011.

(51) Int. Cl.
*H03F 3/68* (2006.01)

(52) U.S. Cl.
USPC .............................................. 330/295; 330/51

(58) Field of Classification Search
USPC ............ 330/51, 53, 54, 69, 124 R, 147, 286, 330/295, 302, 306, 310
See application file for complete search history.

(56) References Cited

U.S. PATENT DOCUMENTS

| 4,598,252 A * | 7/1986 | Andricos ........................... 330/51 |
| 5,834,975 A * | 11/1998 | Bartlett et al. ................. 330/278 |
| 8,013,771 B2 | 9/2011 | Booth et al. |

OTHER PUBLICATIONS

P. Pfeuty, Annals of Physics 57, 79 (1970).
J. Roland, N. J. Cerf, Phys. Rev. A 65, 042308 (2002).
D. Bacon, S. T. Flammia, Adiabatic cluster state quantum computing, arXiv:0912.2098 (2009).
O. Oreshkov, T. A. Brun, D. A. Lidar, Phys. Rev. Lett. 102, 070502 (2009).
O. Oreshkov, Phys. Rev. Lett. 103, 090502 (2009).
M. A. Nielsen, Rep. on Math. Phys. 57, 147 (2006).
S. D. Bartlett, T. Rudolph, Phys. Rev. A 74, 040302 (2006).
D. Bacon, S. T. Flammia, Phys. Rev. Lett. 103, 120504 (2009).
G. Schaller, S. Mostame, R. Schützhold, Phys. Rev. A 73, 062307 (2006).
R. Oliveira, B. Terhal, Quantum Information & Computation 8, 0900 (2008).
A. Doherty, S. Bartlett, Phys. Rev. Lett. 103, 020506 (2009).
J. K. Pachos, M. B. Plenio, Phys. Rev. Lett. 93, 056402 (2004).
E. Lieb, T. Schultz, D. Mattis, Annals Phys. 16, 407 (1961).
F. Verstraete, D. Porras, J. I. Cirac, Phys. Rev. Lett. 93, 227205 (2004).
S. R. White, Phys. Rev. Lett. 69, 2863 (1992).
U. Schollwöck, Rev. Mod. Phys. 77, 259 (2005).
J. Dorier, F. Becca, F. Mila, Phys. Rev. B 72, 024448 (2005).
I. Buluta, F. Nori, Science 326, 108 (2009).

(Continued)

*Primary Examiner* — Khanh V Nguyen
(74) *Attorney, Agent, or Firm* — McDonnell Boehnen Hulbert & Berghoff LLP

(57) ABSTRACT

Disclosed herein is an improved power amplifier, referred to as a Switched-Capacitor Radio Frequency Power Amplification (SCPA). The SCPA may be fabricated with scale CMOS technology. The SCPA may include a plurality of stages, each stage including a storage device, a switch, and selection circuitry. Various combinations of the stages may produce an output signal based on characteristics of a reference signal to be amplified. The output from the stages may be combined to create an amplified approximate square wave. The amplified square wave may be filtered by output circuitry such as a bandpass matching circuit, resulting in an output signal that may be an amplified version of the reference signal.

20 Claims, 10 Drawing Sheets

(56) References Cited

OTHER PUBLICATIONS

W. Wootters, W. Zurek, Nature 299, 802 (1982).

G. M. Crosswhite, D. Bacon, Phys. Rev. A 78, 012356 (2008).

L. R. Kahn, "Single-Sideband Transmission by Envelope Elimination and Restoration," Proceedings of the IRE, vol. 40, pp. 803-806, Jul. 1952.

M.Talonen and S. Lindfors, "System requirements for OFDM polar transmitters," in Proc. European Conf. Circuit Theory and Design, 2005, vol. 3,pp. III/69-III/72.

Robert Bogdan Staszewski, et al., "All-Digital PLL and Transmitter for Mobile Phones," IEEE Journal of Solid-State Circuits, vol. 40, pp. 2469-2482, 2005.

Tsai-Pi Hung, Jeremy Rode, Lawrence E. Larson, and Peter M. Asbeck, "Design of H-Bridge Class-D Power Amplifiers for Digital Pulse Modulation Transmitters," IEEE Transactions on Microwave Theory and Techniques, vol. 55, pp. 2845-2855, 2007.

Jason T. Stauth and Seth R. Sanders, "A 2.4GHz, 20dBm Class-D PA with Single-Bit Digital Polar Modulation in 90nm CMOS," in IEEE Custom Integrated Circuits Conference, 2008, pp. 737-740.

A. Kavousian, D. Su and B Wooley, "A Digitally Modulated Polar CMOS PA with 20MHz Signal BW", ISSCC Dig. Tech. Papers, pp. 78-79, Feb. 2007.

Amin Shameli, Aminghasem Safarian, Ahmadreza Rofougaran, Maryam Rofougaran, and Franco De Flaviis,, "A Two-Point Modulation Technique for CMOS Power Amplifier in Polar Transmitter Architecture," IEEE Transactions on Microwave Theory and Techniques, vol. 56, pp. 31-38, 2008.

Xin He, Manel Collados, Nenad Pavlovic, and Jan van Sinderen, "A 1.2V, 17dBm Digital Polar CMOS PA with Transformer-Based Power Interpolating," in IEEE European Solid-State Circuits Conference, 2008, pp. 486-489.

Calogero D. Presti, Francesco Carrara, Antonino Scuderi, Peter M. Asbeck, and Giuseppe Palmisano, "A 25 dBm Digitally Modulated CMOS Power Amplifier for WCDMA/EDGE/OFDM With Adaptive Digital Predistortion and Efficient Power Control," IEEE Journal of Solid-State Circuits, vol. 44, pp. 1883-1896, 2009.

Satapron Pornpromlikit, Jinho Jeong, Calogero D. Presti, Antonino Scuderi, and Peter M. Asbeck, "A 25-dBm high-efficiency digitally-modulated SOI CMOS power amplifier for multi-standard RF polar transmitters," in IEEE Radio Frequency Integrated Circuits Symposium, 2009, pp. 157-160.

Paul T. M. van Zeijl, and Manel Collados, "A digital envelope modulator for a WLAN OFDM polar transmitter in 90nm CMOS," IEEE Journal of Solid-State Circuits, vol. 42, pp. 2204-2211, 2007.

* cited by examiner

| | C1 | C2 | C3 | C4 | C5 | C6 | C7 | C8 |
|---|---|---|---|---|---|---|---|---|
| 0000 | GND | GND | GND | GND | GND | GND | GND | GND |
| 0001 | GND→VDD | GND | GND | GND | GND | GND | GND | GND |
| 0010 | GND→VDD | GND→VDD | GND | GND | GND | GND | GND | GND |
| 0011 | GND→VDD | GND→VDD | GND→VDD | GND | GND | GND | GND | GND |
| 0100 | GND→VDD | GND→VDD | GND→VDD | GND→VDD | GND | GND | GND | GND |
| 0101 | GND→VDD | GND→VDD | GND→VDD | GND→VDD | GND→VDD | GND | GND | GND |
| 0110 | GND→VDD | GND→VDD | GND→VDD | GND→VDD | GND→VDD | GND | GND | GND |
| 0111 | GND→VDD | GND→VDD | GND→VDD | GND→VDD | GND→VDD | GND→VDD | GND→VDD | GND |
| 1000 | GND→VDD | GND→VDD | GND→VDD | GND→VDD | GND→VDD | GND→VDD | GND→VDD | GND→VDD |
| 1001 | GND→VDD2 | GND→VDD | GND→VDD | GND→VDD | GND→VDD | GND→VDD | GND→VDD | GND→VDD |
| 1010 | GND→VDD2 | GND→VDD2 | GND→VDD | GND→VDD | GND→VDD | GND→VDD | GND→VDD | GND→VDD |
| 1011 | GND→VDD2 | GND→VDD2 | GND→VDD2 | GND→VDD | GND→VDD | GND→VDD | GND→VDD | GND→VDD |
| 1100 | GND→VDD2 | GND→VDD2 | GND→VDD2 | GND→VDD2 | GND→VDD | GND→VDD | GND→VDD | GND→VDD |
| 1101 | GND→VDD2 | GND→VDD2 | GND→VDD2 | GND→VDD2 | GND→VDD2 | GND→VDD | GND→VDD | GND→VDD |
| 1110 | GND→VDD2 | GND→VDD2 | GND→VDD2 | GND→VDD2 | GND→VDD2 | GND→VDD2 | GND→VDD | GND→VDD |
| 1111 | GND→VDD2 | GND→VDD2 | GND→VDD2 | GND→VDD2 | GND→VDD2 | GND→VDD2 | GND→VDD2 | GND→VDD |

Figure 2A

| | C1 | C2 | C3 | C4 | C5 | C6 | C7 | C8A (C2) | C8B (C2) |
|---|---|---|---|---|---|---|---|---|---|
| 0000 | GND | GND | GND | GND | GND | GND | GND | GND | GND |
| 0001 | GND →VDD | GND | GND | GND | GND | GND | GND | GND | GND |
| 0010 | GND →VDD | GND →VDD | GND | GND | GND | GND | GND | GND | GND |
| 0011 | GND →VDD | GND →VDD | GND →VDD | GND | GND | GND | GND | GND | GND |
| 0100 | GND →VDD | GND →VDD | GND →VDD | GND →VDD | GND | GND | GND | GND | GND |
| 0101 | GND →VDD | GND →VDD | GND →VDD | GND →VDD | GND →VDD | GND | GND | GND | GND |
| 0110 | GND →VDD | GND →VDD | GND →VDD | GND →VDD | GND →VDD | GND →VDD | GND | GND | GND |
| 0111 | GND →VDD | GND →VDD | GND →VDD | GND →VDD | GND →VDD | GND →VDD | GND →VDD | GND | GND |
| 1000 | GND →VDD2 | GND →VDD2 | GND →VDD2 | GND →VDD2 | GND | GND | GND | GND | GND |
| 1001 | GND →VDD2 | GND →VDD2 | GND →VDD2 | GND →VDD2 | GND | GND | GND | GND →VDD | GND |
| 1010 | GND →VDD2 | GND →VDD2 | GND →VDD2 | GND →VDD2 | GND →VDD2 | GND | GND | GND | GND |
| 1011 | GND →VDD2 | GND →VDD2 | GND →VDD2 | GND →VDD2 | GND →VDD2 | GND | GND | GND →VDD | GND |
| 1100 | GND →VDD2 | GND →VDD2 | GND →VDD2 | GND →VDD2 | GND →VDD2 | GND →VDD2 | GND | GND | GND |
| 1101 | GND →VDD2 | GND →VDD2 | GND →VDD2 | GND →VDD2 | GND →VDD2 | GND →VDD2 | GND | GND →VDD | GND |
| 1110 | GND →VDD2 | GND →VDD2 | GND →VDD2 | GND →VDD2 | GND →VDD2 | GND →VDD2 | GND →VDD2 | GND | GND |
| 1111 | GND →VDD2 | GND →VDD2 | GND →VDD2 | GND →VDD2 | GND →VDD2 | GND →VDD2 | GND →VDD2 | GND →VDD | GND |

Figure 2B

ALL-DIGITAL SWITCHED-CAPACITOR RADIO FREQUENCY POWER AMPLIFICATION

CROSS-REFERENCE TO RELATED APPLICATIONS

This application claims priority to U.S. Provisional Patent Application Ser. No. 61/334,027 filed on May 12, 2010 and U.S. Provisional Patent Application Ser. No. 61/432,856 filed on Jan. 14, 2011, which are hereby incorporated by reference in their entirety.

BACKGROUND

Recent years have seen rapid advancement in the field of wireless-communication technologies for use in consumer electronics and other devices. This advancement has been driven, at least in part, by demand for lower-cost, higher-performance wireless transceivers. Many advances in wireless transceivers have been enabled by improvements in complementary metal-oxide-semiconductor (CMOS) technologies. In fact, many components of wireless transceivers may now be integrated in CMOS chips, reducing the cost of wireless transceivers and, in turn, reducing the costs of the devices in which wireless transceivers are implemented. Scaled CMOS technology enables cost-effective full integration of single-chip radio systems as a result of its ability to simultaneously process analog, digital, and radio frequency (RF) signals. Although many sub-systems have been integrated in CMOS (e.g., Bluetooth, WLAN, and cellular telephone systems), the RF power amplifier has yet to be integrated in high-volume CMOS systems.

Power amplifiers have not been fully implemented in CMOS at least because it has proven difficult to achieve desirable operating characteristics of a power amplifier using CMOS technology. As an example of such operating characteristics, power amplifiers are typically required to operate at a sufficiently high output power level, have high energy efficiency, and exhibit sufficient linearity in amplification. The design of a given power amplifier system will require tradeoffs between these three parameters. However, inherent limitations of CMOS technology have limited the ability of CMOS-based designs to achieve desired combinations of such parameters.

Metal-oxide-semiconductor field-effect transistors (MOSFETs) are common in systems that are integrated in CMOS, including switching amplifiers in which MOSFETS are operated as binary switches. Such MOSFETS may play an important role, at least, in controlling the selection of the output voltages of the switching amplifier. The scaling of the minimum feature size and power-supply voltage in CMOS has enabled MOSFETs to switch at increasing speeds with decreasing dynamic power consumption, resulting in higher energy efficiencies. However, the associated lower operating voltage of such higher-efficiency MOSFETS may require the use of a higher impedance transformation ratio to produce a given output power. Further, the use of CMOS switches in power amplifiers typically requires additional circuits to, among other things, modulate output signal level. Such additional circuitry leads to complex designs that often require relatively large chip areas and relatively large amounts power consumption.

An improved power amplifier is therefore desired.

SUMMARY

Digital power amplifiers (DPAs) may use an array of amplifier stages that are connected in parallel and controlled so as to modulate the effective gain (or amplification) of the power amplifier. The transfer characteristic of such DPAs may be approximately linear for small output values. That is, for small output values, increases in input values result in linear increases in output values. However, such transfer characteristics of DPAs often saturate for large outputs. That is, for large output values, increases in input values result in nonlinear increases in output values (e.g., a given increase in input value may result in an increase in output value that is less than the increase that would be observed if a corresponding increase occurred at lower input values). Hence, additional circuitry and/or other elements (such as, for example, additional amplifier stages) may be required to enhance the overall linearity of the DPA over large swings in input voltage.

Disclosed herein is a new DPA architecture that more accurately controls the amplitude of the DPA's signal by controlling charge transfer in a plurality of DPA stages, each stage including a storage element (e.g., a capacitor). The SCPA generally operates so as to amplify a reference signal by using phase and amplitude information regarding the reference signal to drive a switch-based amplification architecture. The respective storage element included in each stage may either be switched between one of two supply voltages and ground or be held at signal ground, depending on certain criteria, (e.g., the amplitude of the envelope of a reference signal that is to be amplified). In this way, a combination of the respective signal output by each stage may be controlled to accurately and efficiently amplify the reference signal. The architecture may be referred to as a Switched-Capacitor Radio Frequency Power Amplifier (SCPA).

The SCPA disclosed herein may have various configurations. In one embodiment, the SCPA may have a plurality of stages, each having a selection circuit, a switch, and a storage element. The selection circuit may be configured to output a selection signal to the switch. In some instances, the selection circuit may also be configured to receive amplitude information corresponding to a reference signal, in which case the selection signal may be based, at least in part, on the amplitude information. The switch may be configured to (a) receive the selection signal from the selection circuit, (b) select an input signal based on the received selection signal from a plurality of input signals, and (c) output the selected input signal to the storage element. The storage element may in turn have a first terminal configured to receive the output of the switch and a second terminal configured to provide an output signal for the SCPA stage. The output of each SCPA stage may then be coupled to a combination circuit that is configured combine a respective output signal from each SCPA stage and thereby provide a combined output signal. The combined output signal may be an approximate square wave having the same fundamental frequency as the reference signal.

The selection circuit, the switch, and the storage element may take various forms. For example, the switch and the selection circuit may be CMOS circuits and the storage element may be a CMOS capacitor. Other examples are possible as well.

The plurality of input signals for each switch may also take various forms. In one example, the plurality of input signals may include a ground signal, a first signal having a first voltage, and a second signal having a second voltage. The first voltage and second voltage may differ, and may be selected based on the amplitude of the reference signal, so as to as provide an accurate amplification of the reference signal.

The SCPA may also include other components. For example, the SCPA may further include a reference circuit configured to provide information to the selection circuit. In some instances the reference circuit may be configured to convert a phase of the reference signal into non-overlapping clock signals. The selection circuit may then use such non-overlapping clock signals to drive logic elements and thereby cause the switch to select the input signal based on the received selection signal.

In another example, the SCPA may further include a bandpass matching circuit configured to receive the combined output signal, remove at least one frequency component of the combined output signal, and substantially match an output impedance of the combination circuit to a subsequent input impedance. The SCPA may include other components as well Also disclosed herein is a method of operation of a SCPA that includes (a) receiving a respective selection signal at each switch from a set of switches, (b) each switch responsively (1) selecting a respective input signal based on the received selection signal and (2) outputting the selected respective input signal, (c) receiving, at a first terminal of each storage element from a set of storage elements, the selected respective input signal output by a respective switch, (d) providing, at a second terminal of each storage element from the set of storage elements, a respective output signal, and (e) combining the respective output signals provided at the second terminal of each storage element to create a combined output signal.

The SCPA disclosed herein may provide various benefits. For example, this architecture may mitigate some of the inefficiencies present in conventional DPAs described above. As another example, this architecture may also provide for high accuracy by taking advantage of the matching of capacitance ratios among capacitors in the respective stages, as enabled by CMOS technologies. As yet another example, the architecture generally does not use space-intensive analog/mixed signal circuitry, can be sized appropriately based on the linearity requirements of a specific application, and, in contrast to most previous approaches, benefits from continued CMOS technology scaling. Other examples are possible as well.

These as well as other aspects and advantages will become apparent to those of ordinary skill in the art by reading the following detailed description, with reference where appropriate to the accompanying drawings.

BRIEF DESCRIPTION OF THE FIGURES

FIG. 2A depicts a first voltage-selection scheme for the example SCPA, in accordance with at least one embodiment;

FIG. 2B depicts a second voltage-selection scheme for the example SCPA, in accordance with at least one embodiment;

DETAILED DESCRIPTION

In the following detailed description, reference is made to the accompanying figures, which form a part thereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

1. Example Architecture

Figure 1:
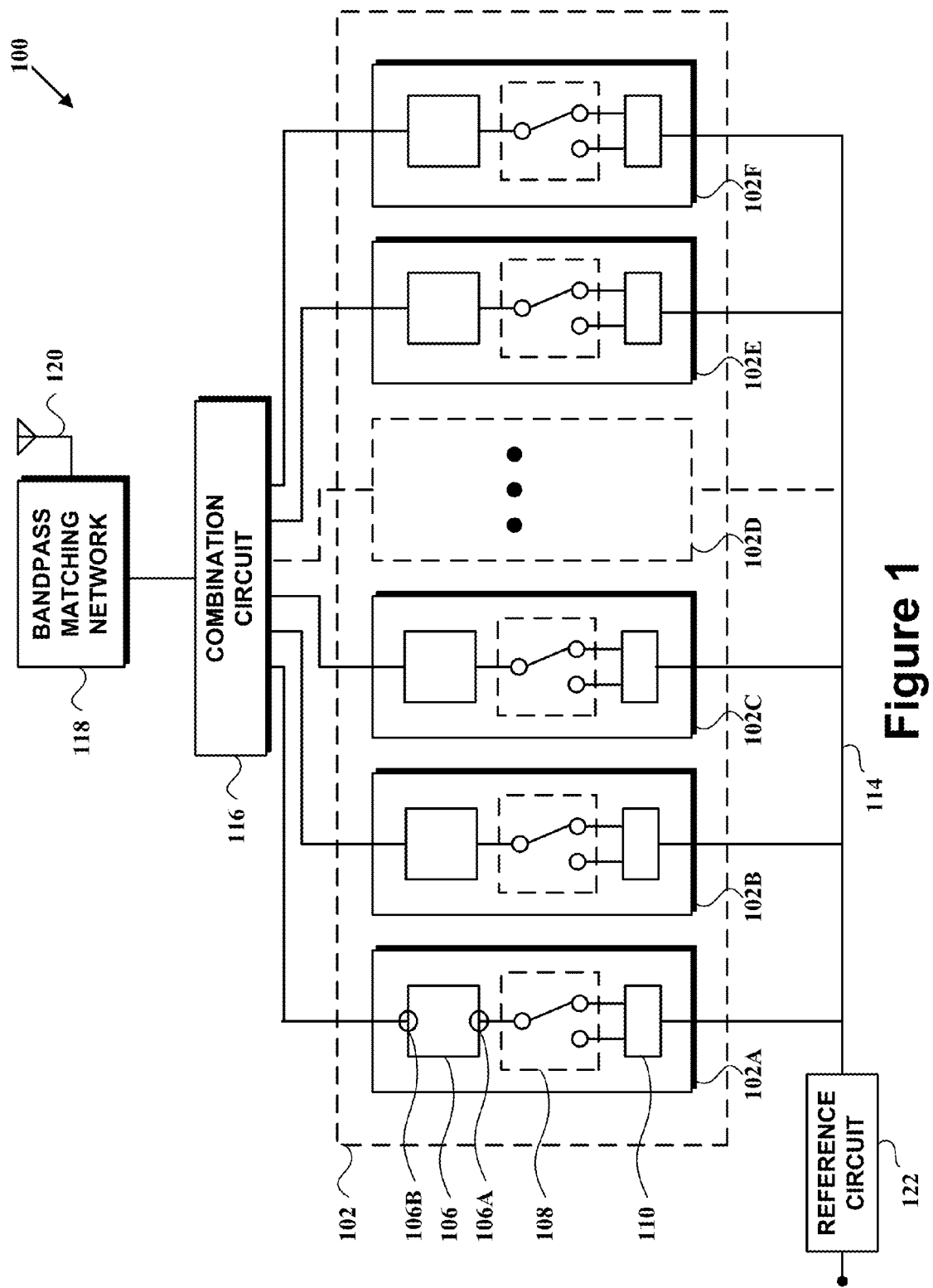
FIG. 1 depicts a simplified block diagram of functional elements included in an example Switched-Capacitor Radio-Frequency Power Amplifier (SCPA), in accordance with at least one embodiment.

FIG. 1 depicts a block diagram of functional elements included in example Switched-Capacitor Radio-Frequency Power Amplifier (SCPA) 100. SCPA 100 generally operates to amplify a reference signal by using phase and amplitude information regarding the reference signal to drive a switch-based amplification architecture. As shown, example SCPA 100 includes a plurality of stages 102, such as stages 102A-102F. (Although the example shown in FIG. 1 includes six stages 102A-102F, this is for purposes of example and explanation only, and it should be understood that SCPA might include more or less than six stages). Generally, each stage may include storage element 106, switch 108, and selection circuit 110. SCPA 100 may also include, or otherwise be coupled to, a combination circuit 116, a bandpass matching network 118, and an antenna 120. SCPA 100 may also be coupled, via communication link 114, to additional circuitry, such as reference circuitry 122 as discussed further below.

Generally, SCPA 100, as well of each of the components described herein as being part of SCPA 100, may include various circuitry and/or other elements. Although the various components of SCPA 100 may be described herein as separate elements, it should be understood that the elements could just as well be physically integrated together or distributed in any suitable manner. Any of the elements, components, and/or circuitry discussed with respect to SCPA 100 (or other examples of SCPAs discussed herein) may be implemented as CMOS circuitry.

Reference circuit 122 may be configured to provide information to the respective selection circuits 110 of each stage 102 of SCPA 100. In general, reference circuit 122 may be configured to receive a reference signal, or some representation of a reference signal, that is to be amplified. In some instances the reference circuit may be configured to convert a phase of the reference signal into non-overlapping clock signals. Further, reference circuit may be configured to convert amplitude information regarding the amplitude of the reference signal into a code word that is also used by selection circuit 110. Thus, the amplitude information may be a binary, or otherwise encoded, information signal that provides a representation of the instantaneous amplitude of the reference signal. It should be understood that, herein, references to the amplitude of the reference signal may refer to the amplitude of the envelope of the reference signal in the event that the reference signal is amplitude modulated.

Generally, selection circuit 110 may be configured to receive the non-overlapping clock signals as well as the amplitude information corresponding to the reference signal. Selection circuit 110 may also be configured to output a selection signal to switch 108. Thus, ultimately, the selection signal provided by selection circuit 110 may be based at least in part, on the amplitude information. Accordingly, selection circuit 110 may be configured to interpret the amplitude information so as to output a selection signal that will cause switch 108 to provide an input signal voltage that corresponds to the instantaneous amplitude of the reference signal. As a general matter, for example, selection circuit 110 may cause switch 108 to provide a relatively low voltage with respect to relatively small amplitudes of the reference signal and may provide a relatively high voltage with respect to relative large amplitudes of the reference signal.

Thus, switch 108 may be configured to receive a selection signal from selection circuit 110 that is used by switch 108 to select a particular input signal to provide to storage element 106B. More particularly, each switch 108 may be configured to (a) receive the selection signal from the selection circuit, (b) select an input signal based on the received selection signal from a plurality of input signals, and (c) output the selected input signal to the storage element. For instance, switch 108 may be switched to provide either a first signal having a non-zero voltage, $V_{DD}$, or a second signal having a ground voltage, $V_{GND}$. Alternatively, switch 108 may be configured to be switched so as to provide at its output one of more than two different voltages. For example, in another example embodiment, switch 108 may be switched to provide either a first non-zero voltage, $V_{DD}$, or a second non-zero voltage, which may be $2V_{DD}$, or a third ground voltage, $V_{GND}$. As described further below, the particular voltages that switch 108 may select for the input signal may vary across embodiments of SCPA 100.

Switch 108 may be a CMOS circuit, however this is not necessary. Switch 108 may be implemented using any circuitry, element, or other technology that is suitable for carrying out the functions described with respect to switch 108. Further, although only three voltages (a first non-zero voltage, $V_{DD}$, or a second non-zero voltage, which may be $2V_{DD}$, or a third ground voltage, $V_{GND}$) are described above, it should be understood that switch 108 may switch between more voltages. For instance, in some embodiments a third non-zero voltage, or any suitable additional number of voltages, may be employed.

As shown in FIG. 1, each storage element 106 may include a first terminal 106B configured to receive the input signal provided by switch 108. Storage element 106 may also include a second terminal 106B that is configured to provide an output signal. Each storage element 106 may take various forms. In one example, each storage element 106 may be a capacitor, such as a CMOS capacitor. Other examples are possible as well. Thus, each storage element 106 may charge based on the voltage of the input signal provided at first terminal 106B such that, according to one example, the output signal provided at second terminal 106B corresponds to the input signal provided at first terminal 106B.

Combination circuit 116 may be configured to provide a combined output signal by combining the output signal provided at second terminal 106B of each storage element 106 in plurality of stages 102. For example, combination circuit 116 may be configured to couple the respective second terminal 106B of each storage element 106 in each of the stages 102 so as to "wire OR" the respective output signals of the stages 102 together into a single combined output signal. Of course, more complex combination circuitry may be used to combine the respective output signals of the stages 102 as well.

Example SCPA 100 may also include or may otherwise be coupled to bandpass matching network 118 and antenna 120. Generally, the combined output signal provided by combination circuit 116 may be filtered by bandpass matching network 118 which drives antenna 120. Bandpass matching network 118 may also transform the impedance of antenna 120 (which may be, for instance, 50Ω, in an embodiment) to a lower value (for instance, ~4Ω, in an embodiment) so that higher power output may be generated by SCPA 100. Antenna 120 may be generally configured to transmit, or otherwise emit, the combined output signal.

Note that although the example shown in FIG. 1 shows a bandpass matching network, other types of matching networks may be used instead, or as well. As one example, a low pass matching network may be coupled to combination circuit 116. As another example various combinations of matching networks, bandpass filters, and/or low pass filters may be connected in series with combination circuit 116. For instance, a low pass filter may be connected in series with bandpass matching network 118. Other combinations of matching networks and/or filters are possible as well.

Turning now to FIG. 2A, voltage-selection chart 200 depicts an example voltage-selection-scheme that may be implemented in an SCPA, such as SCPA 100, to provide efficient amplification of the reference signal. According to the voltage-selection scheme of FIG. 2A, at a given time, the storage elements 106 in each of stages 102 may be switched between either of $V_{DD}$ or $2V_{DD}$, or may be grounded. The first vertical column 202 depicts amplitude information, such as code words, corresponding to the amplitude of a reference signal to be amplified. Such amplitude information may be amplitude information provided by reference circuit 122 to selection circuit 110 as described above.

The horizontal column 204 depicts the index of each specific stage, for example stages 102A-102F. In the example shown in FIG. 2A, there are 8 stages (C1-C8). Although FIG. 2A depicts 8 stages, this is for purposes of example and explanation only. As described above with respect to FIG. 1, a given SCPA may include more or less stages.

As shown in FIG. 2A, for all code words with the first bit equal to 0, the switch may output 0 or $V_{DD}$. However, for all code words with the first bit equal to 1, the switch may output 0, $V_{DD}$, or $2V_{DD}$. Therefore, the output voltage of each stage is dependent on the actual bit string of the code word as well as the index of the specific stage. Selection circuit 110 will generally interpret such a code word and cause switch 108 to provide the indicated voltage to storage element 106. Thus at a given point in time, it is possible that one storage element may output $V_{DD}$ and at the same time, another storage element may output $2V_{DD}$.

It should be also that while FIG. 2A represents certain DC voltage at 0, or GND, this is not necessary. That is, any such DC voltage may instead be set equal to $V_{DD}$ or $2V_{DD}$. Generally, such a DC component will not impact the combination of the combined output signal, as only the AC component is of interest—aside, any such DC component may be filtered by filtering circuitry such as bandpass matching network 118.

Figure 3:
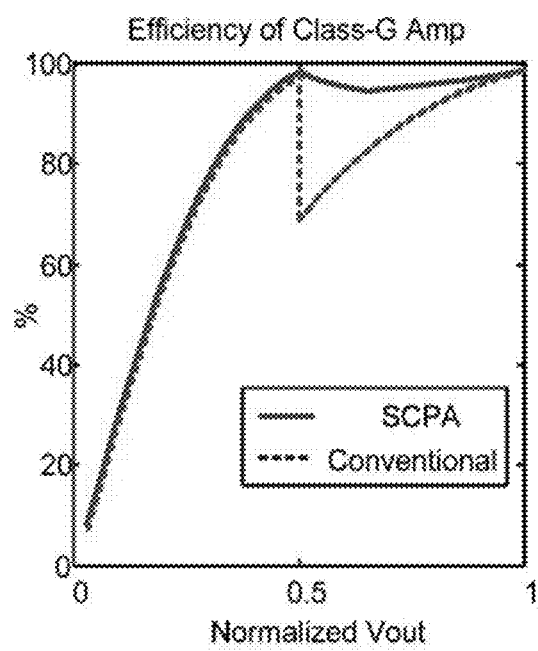
FIG. 3 depicts an additional efficiency curve for at least one embodiment of the example SCPA.

FIG. 3 depicts an efficiency curve for an SCPA operating according to the voltage-selection scheme set forth in FIG. 2A. As noted, an SCPA operating according to the voltage-selection scheme set forth in FIG. 2A may output both $V_{DD}$ and $2V_{DD}$ in respective storage elements of stages 102 simultaneously, and thus may provide for a high and relatively continuous efficiency curve. This is possible because individual stages 102 may use different supply voltages at the same time, one the output signal exceeds one half of the normalized output voltage. Another advantage of an SCPA operating according to the voltage-selection scheme set forth in FIG. 2A is that it is possible to achieve smooth transition of the efficiency curve, which leads to higher efficiency in the range of normalized output voltages from 0.5 to 1. As a general matter, given more supply voltages and/or more stages, an SCPA operating according to the principles of the voltage-selection scheme set forth in FIG. 2A may exhibit more efficiency peaks and/or higher overall efficiency.

Turning now to FIG. 2B, a voltage-selection scheme that would result in the conventional efficiency curve depicted in FIG. 3 is presented. Voltage-selection chart 250 depicts a voltage-scheme that may be implemented in an SCPA, such as example SCPA 100, to provide functionality similar to that of a class-G power amplifier. According to the voltage-selection scheme of FIG. 2B, at a given time, the storage elements 106 in each of stages 102 may output one of $V_{DD}$ or $2V_{DD}$, or may be grounded. The first vertical column 202 depicts amplitude information, such as code words, corresponding to the amplitude of the reference signal to be amplified. The horizontal column 204 depicts the index of each specific stage, for example stages 102A-102F. In the example shown in FIG. 2B, there are 9 stages (C1-C8B). Note that although FIG. 2B represents 9 stages, this is for purposes of example and explanation only. For all code words with the first bit equal to 0, the output signal will be either 0 or $V_{DD}$. However, for all code words with the first bit equal to 1, the switch will output either 0 or $2V_{DD}$. Therefore, the output voltage of each stage is dependent on the most significant bit (or the amplitude) of the reference signal to be amplified. Thus at a given point in time, it is possible that one storage element may output 0 or $V_{DD}$ or may output 0 or $2V_{DD}$. However, at a given point in time, it is not possible that one storage element may output $V_{DD}$ and, at the same time, another storage element may output $2V_{DD}$.

Figure 4B:
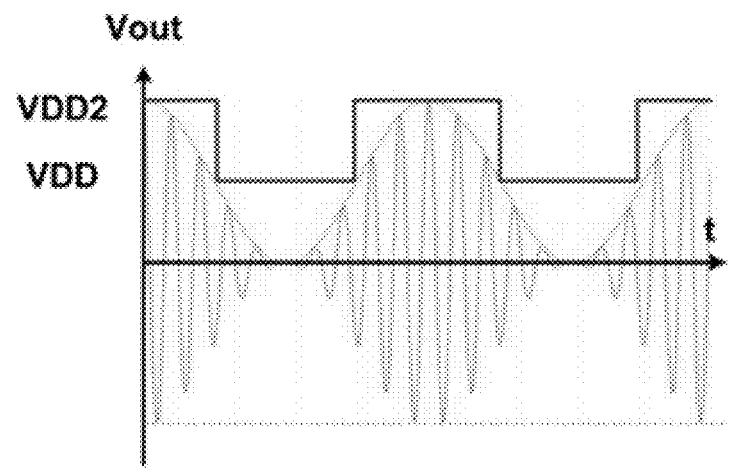
FIG. 4B depicts voltage supplies with respect to a reference signal, in accordance with at least one embodiment.
Figure 4A:
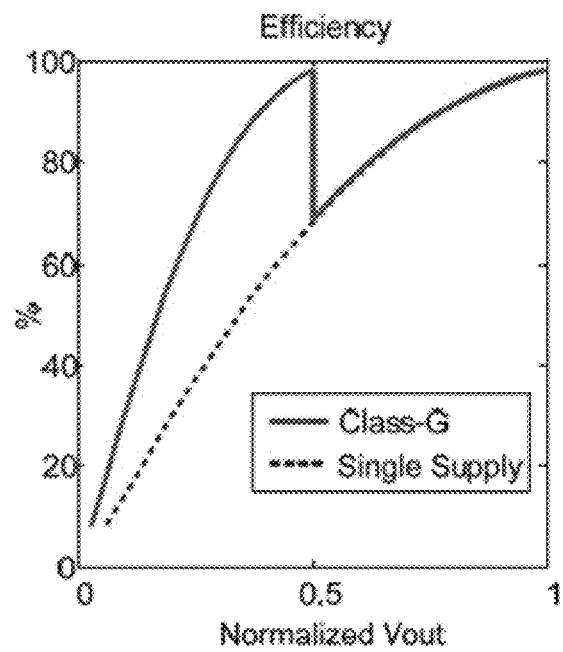
FIG. 4A depicts an efficiency curve for at least one embodiment of the example SCPA.

FIG. 4A depicts an efficiency curve for an SCPA operating according to the class-G-type voltage-selection scheme set forth in FIG. 2B. As can be seen in FIG. 4A, if $V_{DD}$ is employed as a supply voltage as well as $2V_{DD}$, there is an efficiency peak at one half of the normalized output power, as opposed to a single peak of efficiency at full normalized power, resulting in improved overall efficiency when compared to the use of a single power supply. However, the efficiency curve shown in FIG. 4A is generally less efficient over the range from one half to full normalized output voltage as compared to the efficiency curve shown in FIG. 3.

As shown in FIG. 4B, in accordance with a representation of $V_{DD}$ and $2V_{DD}$ shown, the first supply voltage is twice the second supply voltage. Hence the class-G-type voltage-selection scheme achieves close to 100% efficiency at both $V_{OUT}$ and $$\frac{V_{OUT}}{2}.$$

The ratio of the two supply voltages may be varied to move the second 100% efficiency point (the 100% efficiency point that is not at $V_{OUT}$) to some point other that 0.5 the normalized power output.

It should be noted that although FIGS. 2A and 2B provide examples of switching schemes that may be carried out by example SCPA 100, they are but examples, and other examples of such switching schemes may exist as well.

Figure 5:
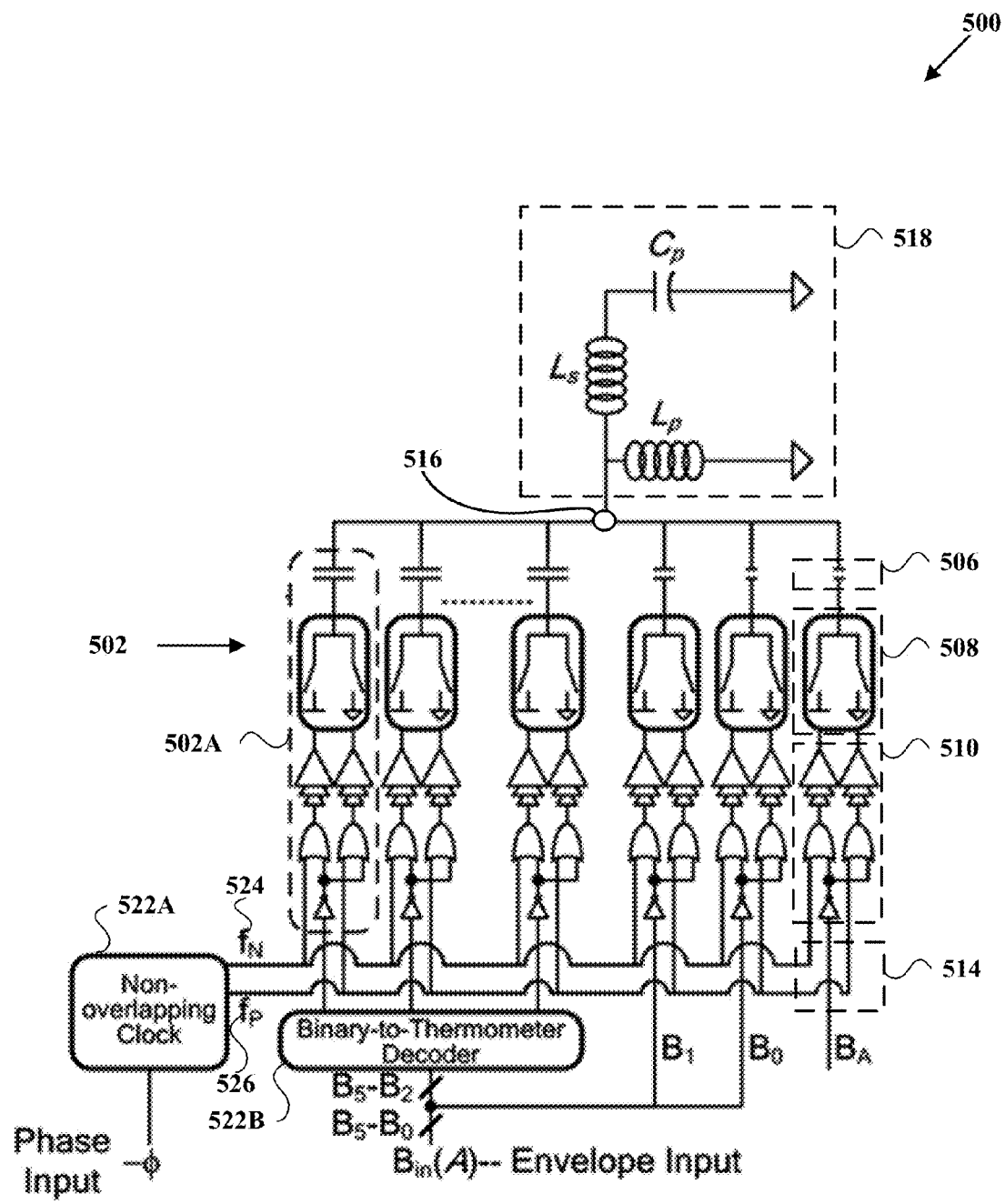
FIG. 5 depicts a high-level schematic of an example embodiment of the example SCPA.

FIG. 5 depicts a high-level schematic an embodiment of example SCPA 500. Generally, the components of example SCPA 500 are numbered so as to correspond to equivalent components shown in example SCPA 100 in FIG. 1. For example, example SCPA 500 includes a plurality of stages 502, one of which is stage 502A. Generally, each stage includes storage element 506, switch 508, and selection circuit 510. SCPA 500 is also shown as including combination circuit 516 and bandpass matching network 518. Further, SCPA 500 shows reference circuitry such as non-overlapping clock circuitry 522A and binary-to-thermometer-decoder circuitry 522B. Such reference circuitry may include additional elements as well. Communication link 514 may couple SCPA 100 to additional circuitry, such as the reference circuitry.

The reference circuitry, such as non-overlapping-clock circuitry 522A and/or binary-to-thermometer-decoder circuitry 522B may be configured to perform various functions. As shown, non-overlapping-clock circuitry 522A may be configured to receive a polar representation (e.g., phase information) of the reference signal. The phase information may be upconverted to the carrier frequency of the reference signal and input as a phase input 510, Φ, to non-overlapping-clock circuitry 522A. As a result, the selection circuit 514, and therefore the stages 502 more generally, will be driven at the carrier frequency of the reference signal. Phase input 510 may then be converted to a differential, non-overlapping, clock signal that is used as the sampling clock in each of stages 102. The non-overlapping clock signals are shown as $f_N$ 524 and $f_P$ 526, output from non-overlapping-clock circuitry 522A.

It is of note that although non-overlapping-clock signals are described herein with reference to FIG. 5, the use of non-overlapping clock signals is not necessary. For instance, a single clock signal may be used in some embodiments. In fact, some CMOS processes may be modified so as to operate more efficiently with a single clock signal.

Binary-to-thermometer-decoder circuitry 522B may be configured to convert a binary representation $B_{in}(A)$ of the amplitude of the envelope associated with an amplitude modulation of the reference signal into a code word that is used by each stage. As described above, ultimately, the voltage at which a given switch operates may be based on such a codeword, and therefore may ultimately be based on the amplitude of the envelope of the reference signal.

Figure 6:
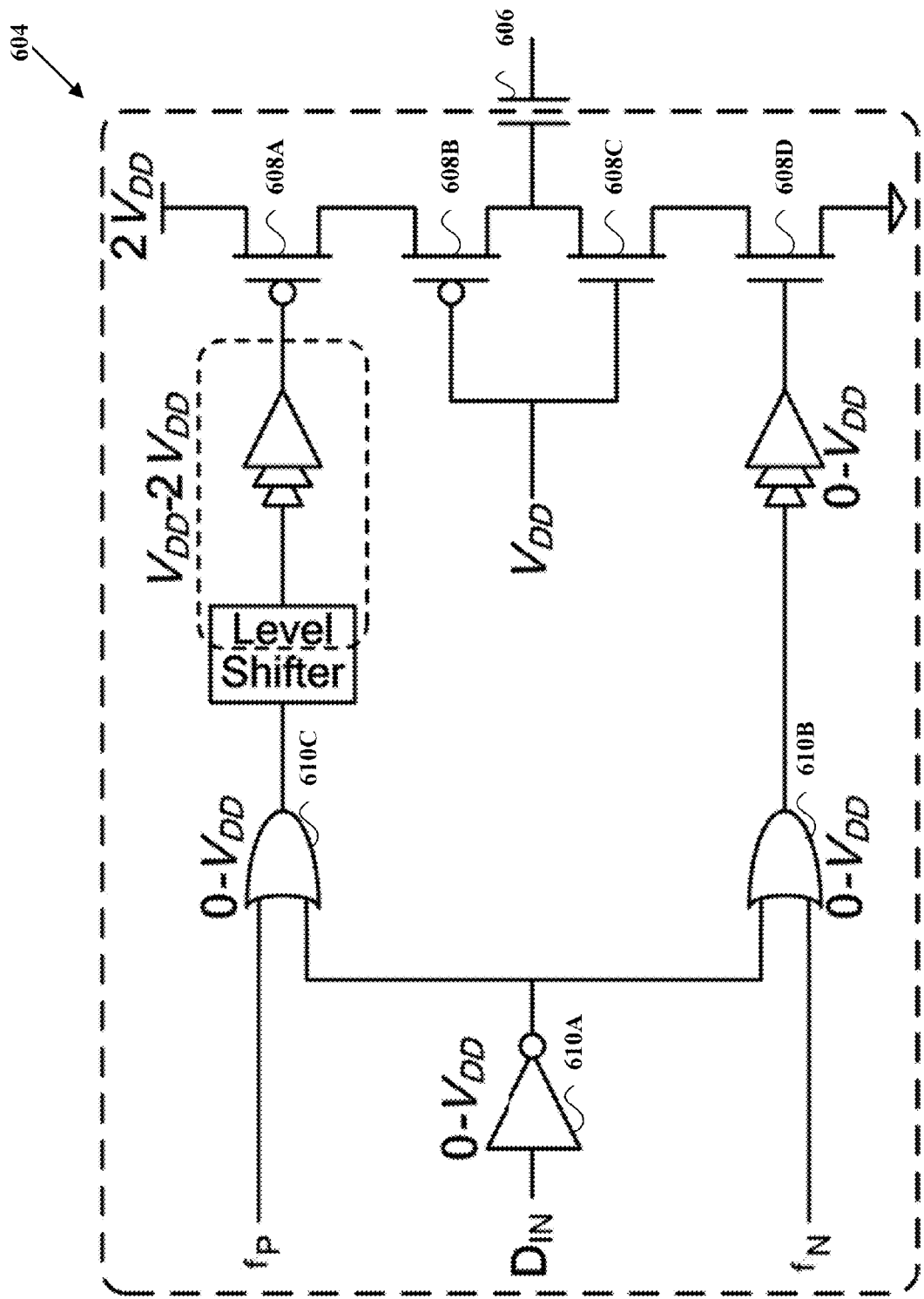
FIG. 6 depicts a circuit schematic of an example stage from the example SCPA, in accordance with at least one embodiment.

Turning now to FIG. 6, a more detailed circuit schematic of an example stage 604 is shown. As can be seen, example stage 604 includes selection circuitry, including logic elements 610A, 610B, and 610C. Example stage 604 also includes switch circuitry, including switching elements 608A, 608B, 608C, and 608D. Additionally, example stage 604 includes a storage element, which is shown as capacitor 606. It should be understood that the circuit schematic of FIG. 6 is just one example of a stage that may be implemented in SCPA 100.

As a general matter, example stage 604 is configured to receive, and operate, according to non-overlapping clock signals $f_N$ and $f_P$. Additionally, example stage 604 is configured to receive an input data bit $D_{IN}$. Each of $f_N$, $f_P$, and $D_{IN}$ may be provided by reference circuitry, as discussed above. The input data bit $D_{IN}$ is one bit from the digital code word $B_{in}(A)$ associated with the amplitude modulation of the reference signal to be amplified. In an example embodiment the value for $D_{IN}$ for each of stages 102 may be either a digital 1 or 0 (corresponding, respectively, to $V_{DD}$ and ground). As a general matter, the number of stages that receive a 1 for the $D_{IN}$ input is proportional to the amplitude of the reference (or input) signal to be amplified.

As shown in FIG. 6, the $D_{IN}$ bit may be passed through inverter logic 610A before then being passed to each of OR logic 610B and 610C. Logical OR 610B, which operates according to the non-overlapping clock phase $f_N$, acts as a control signal for an n-type metal-oxide-semiconductor (NMOS) transistor 608A. Logical OR 610C, which operates according to the non-overlapping clock phase $f_P$, acts as a control signal for a p-type metal-oxide-semiconductor (PMOS) transistor 608D. The NMOS and PMOS transistors function as switches that are used to control the charging (and/or discharging) of capacitor 606. Those of skill in the art will appreciate that stage 604, and the selection circuitry in particular, could be realized with various combinations of logic gates and/or other circuitry. The particular combination of logic gates and/or other circuitry used can be selected depending on the particular specifications of a given SCPA.

The example architecture shown in FIG. 6 enables example stage 604 to operate over a supply voltage range of 0 to $2V_{DD}$, while at the same time minimizing the impact of voltage stress on any individual CMOS device contained in stage 604. The NMOS and PMOS transistor switches 608A-608D driving capacitor 606 are placed together in a complementary pair and sized to provide the necessary drive current to charge and discharge capacitor 606. PMOS transistor 608A operates from a supply voltage range of $V_{DD}$-2VDD, while NMOS transistor 608D operates from 0-$V_{DD}$. Accordingly, a level-shifting circuit may boost the voltage range of the signal after logical OR 610C operation, which is in the signal path of PMOS transistor 608A. The level-shifting circuit may also receive part of the digital code word $B_{in}(A)$ in order to operate.

Thus, in accordance with an example embodiment, a single stage may produce one of three output voltages at a given time: 0, $V_{DD}$, or $2V_{DD}$. The determination of the output of the stage is described further below with respect to FIGS. 6A-6B. The output may have a period similar to the period of the reference signal to be amplified. Ultimately, therefore, the output of stage is dependent on the digital code word $B_{in}(A)$, an index value associated with each respective stage, and non-overlapping clock phases $f_N$ and $f_P$.

As noted above, in some embodiments, stage 604 may not operate from 0-$2V_{DD}$, but rather only from 0-$V_{DD}$. In this case, stage 604 would only be able to output 0 or $V_{DD}$. Those of skill in the art will appreciate that, in examples where the output voltage is 0 or $V_{DD}$, the power amplifier may operate, in some aspects, similar to a class-D amplifier in that the power amplifier switches between a single non-zero voltage. Those of skill in the art will also appreciate that, in examples where the output voltage is 0, $V_{DD}$, or $2V_{DD}$, the power amplifier may operate, in some aspects, more like a class-G amplifier in that the power amplifier may switch between two non-zero voltages. Nonetheless, as discussed above with respect to the voltage-selection scheme set forth in FIG. 2A, beyond providing a novel architecture by which typical switching-amplifier functionality may be achieved, the SCPA disclosed herein may be configured to provide additional efficiencies beyond such typical switching amplifiers.

Potentially, one of the most severe sources of power loss associated with typical switching amplifiers is crowbar current, or a short-circuit current which may occur when the switching transistors, such as NMOS and PMOS transistors 608A-608D are ON for brief periods of time. For example, with reference to FIG. 7, transistor arrangement 702, operating according to a single clock signal, Φ, may short circuit if the transistors are on at the same time. The transition period between clock signals may cause both of the transistors to be on for a short period of time, and thus may cause a short circuit through the transistors. This short circuit may cause an undesirable waste of excessive power.

Figure 7:
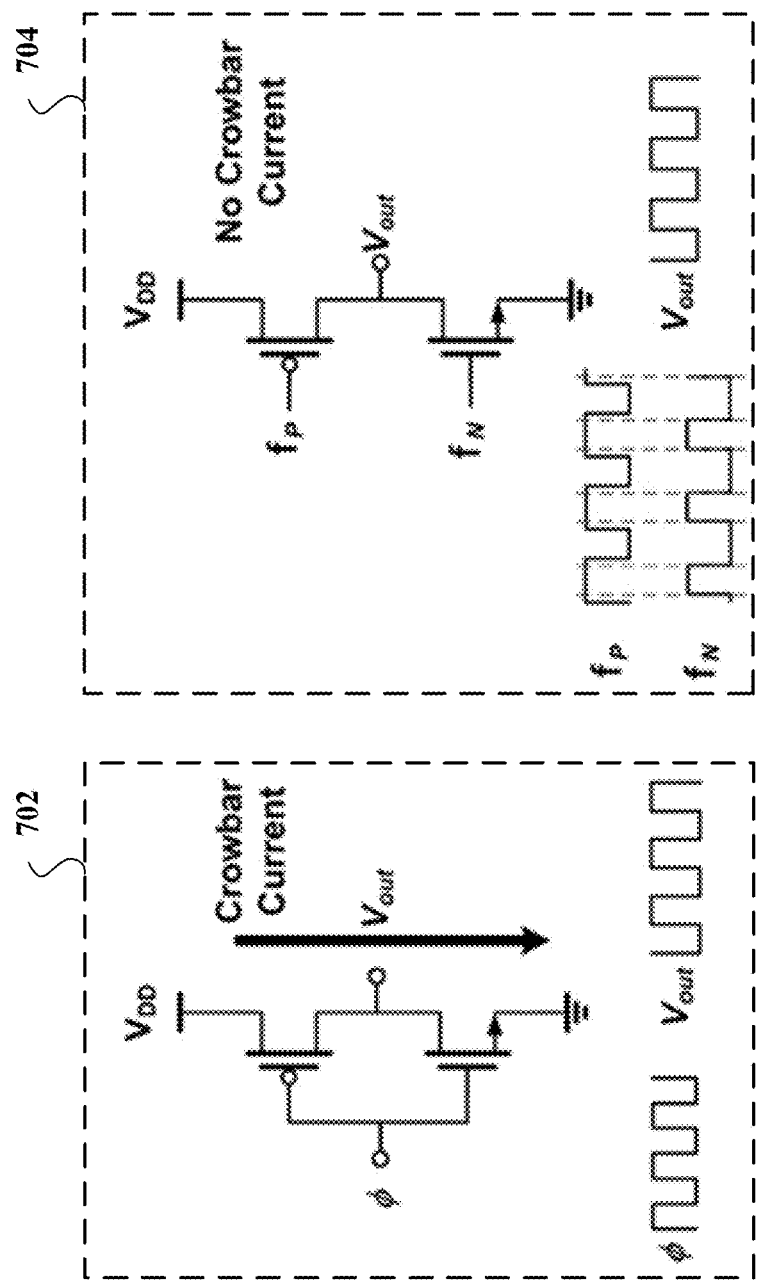
FIG. 7 depicts a transistor pair operating according to non-overlapping clock signals, in accordance with at least one embodiment.

However, one approach to preventing such short-circuit current is to use non-overlapping clock timing signals, $f_N$ and $f_P$ as shown in transistor arrangement 704 of FIG. 7, to drive the transistors. Use of non-overlapping clock signals helps to ensure that there is a brief period of time that neither one of the transistors are on at the same time. Using this non-overlapping timing scheme, there is a period of time when the switch has high resistance since both switches are turned off, and thus no current may be allowed to flow. It should be understood that transistor arrangement 704 shown in FIG. 7 is set forth for purposes of example and explanation only and that other examples of transistor arrangements that prevent short-circuit current may exist as well.

Figure 8:
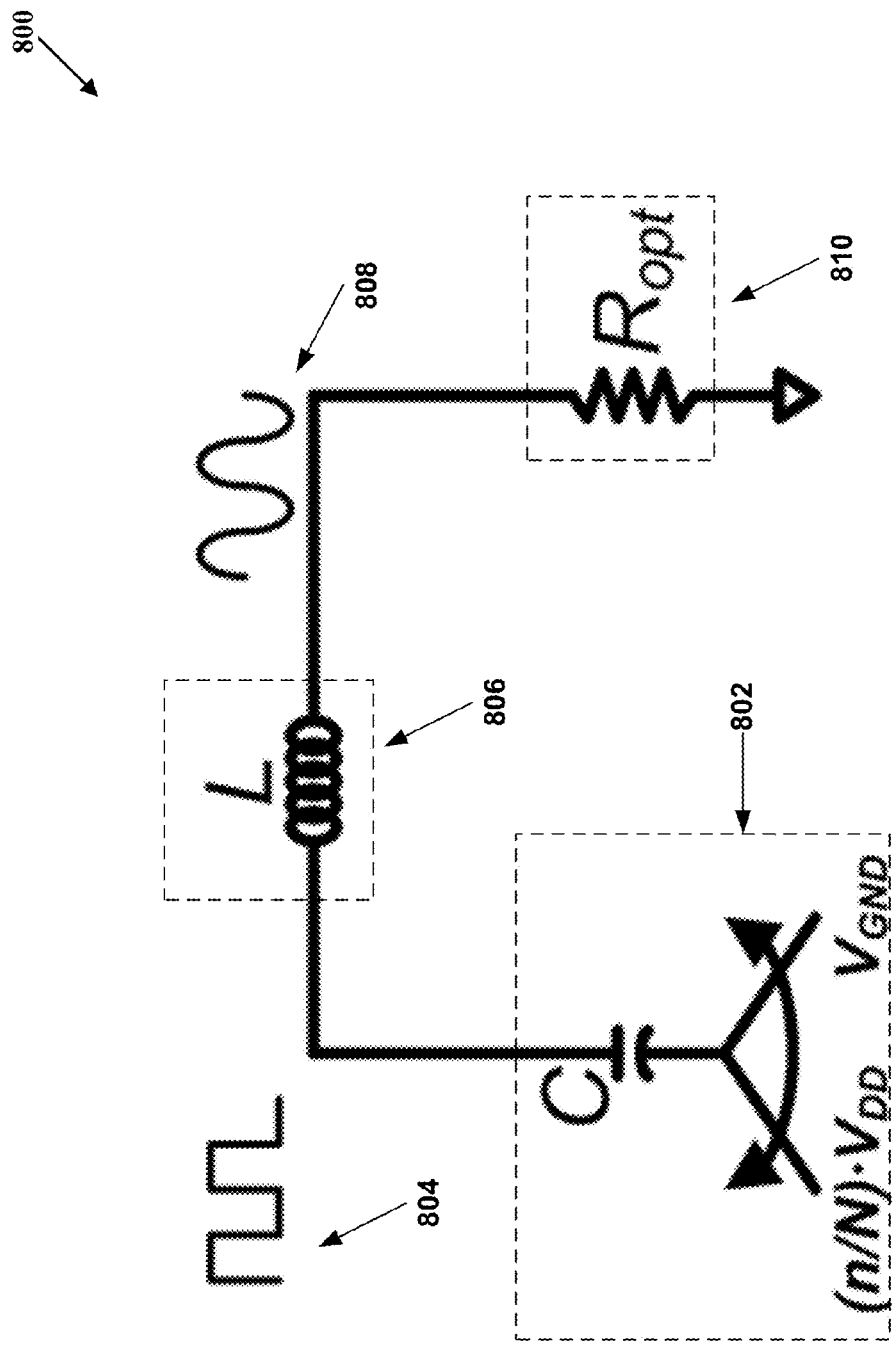
FIG. 8 depicts an equivalent circuit representing the example SCPA.

FIG. 8 depicts an equivalent circuit 800 of plurality of stages 102, represented as a simplified equivalent circuit 802 including a switch (that may be switched between a single voltage $V_{DD}$ and ground $V_{GND}$) and capacitor, coupled to a matching network. The equivalent circuit 802 is connected in series with an inductor, L 806, and resistor, $R_{opt}$ 810, as shown in FIG. 8. The inductor 806 represents bandpass matching network 118 having excessive reactive impedance, which performs filtering of the combined output signal provided by combination circuit 116. Equivalent circuit 800 also has $R_{opt}$ 810, the optimum termination resistance for the desired output power, connected in series.

Often, performance parameters that generally are of particular interest when designing a power amplifier are output power and energy efficiency. The output power of the equivalent circuit shown in FIG. 8, and thus SCPA 100, may be determined by:

$$P_{OUT} = \frac{2}{\pi^2} \left(\frac{n}{N}\right)^2 \frac{V_{DD}^2}{R_{OPT}}$$

where n represents the number of capacitors having first terminals that are switched at a given voltage and N represents the total number of capacitors (or stages) in SCPA 100. The combined output signal produced when the simplified equivalent circuit 802 is switched between $$\frac{n}{N} * V_{DD}$$

and $V_{GND}$ may resemble a square wave 804. Inductor 806 (bandpass matching network 118) may act as a low pass filter and allow only the fundamental frequency of the square wave to propagate, as shown by filtered combined output signal 808. Thus, the signal output by bandpass matching network 118, filtered combined output signal 808, may resemble an amplified carrier waveform with a frequency similar to the switching frequency of the simplified equivalent circuit 802 and similar to the frequency of the reference signal.

2. Example Operation

Figure 9:
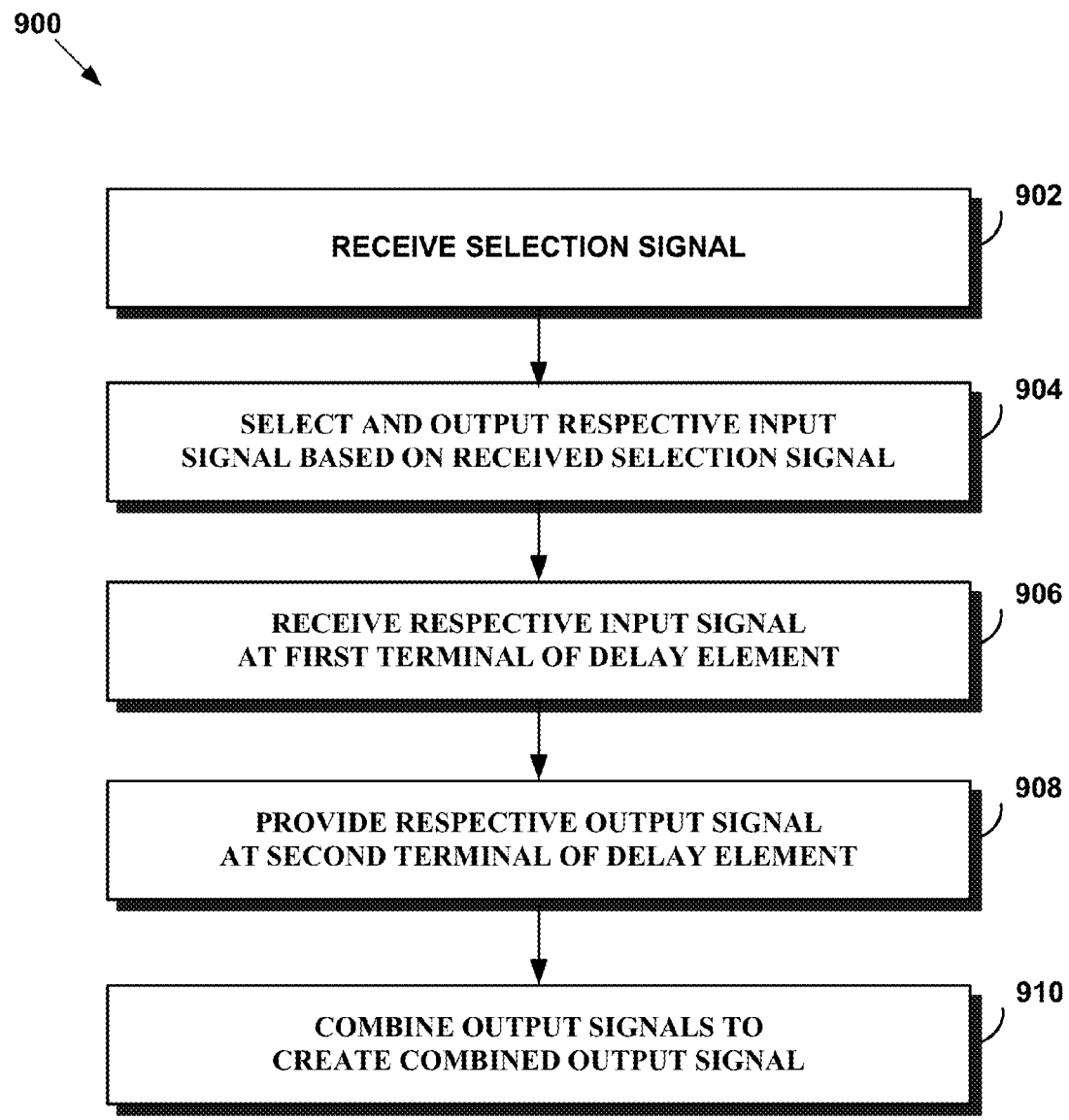
FIG. 9 depicts a simplified flow diagram of an example method that may be carried out by the example SCPA, in accordance with at least one embodiment.

FIG. 9 depicts a simplified flow diagram of an example method 900 that may be carried out by an SCPA. It should be understood that, although the blocks of FIG. 9 are shown in a linear order, they do not necessarily need to be performed in the specific order. Further, additional steps may be included which are not pictured in FIG. 9.

Example method 900 begins with step 902, where an SCPA receives a selection signal at each switch from a set of switches. At step 904, each switch responsively (a) selects a respective input signal based on the received selection signal and (b) outputs the selected respective input signal. At step 906, the SCPA receives, at a first terminal of each storage element from a set of storage elements, the selected respective input signal output by a respective switch. At step 908, the SCPA provides, at a second terminal of each storage element from the set of storage elements, a respective output signal. And at step 910, the SCPA combines the respective output signals provided at the second terminal of each storage element to create a combined output signal. Each of these steps is discussed further below.

Method 900 begins with step 902, where an SCPA receives a selection signal at each switch from a set of switches. Here, the selection signal is provided to each switch, perhaps by of a selection circuit as described above, based on an envelope of a reference signal to be amplified. The envelope of the reference signal may be converted to a digital thermometer code as well. The number of 1s in the digital thermometer code may correspond to the number of stages that are to produce an output at a given time. Additionally, the number of 0s in the digital thermometer code may correspond to the number of stages that are to produce no output (or produce an output corresponding to ground) at a given time.

At step 904, each switch responsively (a) selects a respective input signal based on the received selection signal and (b) outputs the selected respective input signal. The selected input signal may be, for example, any one of 0, $V_{DD}$, and $2V_{DD}$, as described above. The selection may be carried out by a selection circuit that is included as part of, or otherwise coupled to, each switch. The selection circuit may therefore receive amplitude information corresponding to the reference signal, wherein the selection signal is based, at least in part on, the amplitude information.

At step 906, the SCPA receives, at a first terminal of each storage element from a set of storage elements, the selected respective input signal output by a respective switch. Accordingly, each storage device may receive an input signal from the respective switch to which it is coupled. As described above, the selected input signal may be, for example, any one of 0, $V_{DD}$, and $2V_{DD}$, and may be the result of a selection by selection circuitry involving both the phase of a reference signal to be amplified and an amplitude of the envelope of the reference signal to be amplified. Thus, the selection circuitry may receive a selection signal that indicates amplitude information corresponding to a reference signal, wherein the selection signal is based, at least in part, on the amplitude information.

At step 908, the SCPA provides, at a second terminal of each storage element from the set of storage elements, a respective output signal. The output signal provided at each second terminal will generally correspond to the signal input to the respective storage element. That is, the output signal may generally be any one of 0, $V_{DD}$, and $2V_{DD}$.

And at step 910, the SCPA combines the respective output signals provided at the second terminal of each storage element to create a combined output signal. That is, the output of each storage device may be combined to form an output signal. The output signal may be a square wave due to the switched nature of the input signal provided to each storage device. The instantaneous amplitude of the output signal may be a function of the number of circuits producing an output at a given time. In other words, the combined output signal may have an amplitude proportional to the number of storage elements that are providing an output to the combination circuit at a given time. As one example, if there are ten storage elements in total, and only five storage elements are producing an output (i.e., a voltage not equal to ground), the amplitude of the output signal may be half of the amplitude of the output signal when all ten storage elements produce an output signal.

Further, prior to receiving the selection signal a reference circuit may receive a reference signal to be amplified and the reference circuit may convert a phase associated with the reference signal into non-overlapping clock signals. Such non-overlapping clock signals may be used to drive the selection of the input signal performed by the selection circuitry.

Further still, the respective output signals may be combined by a combination circuit. A bandpass matching network, or some other suitable circuitry, may remove at least one frequency component from the combined output signal. That is, the combined output signal may be filtered. Further, an output impedance of the combination circuit may be substantially matched to subsequent impedance (e.g. the impedance of the bandpass matching network).

4. Conclusion

Exemplary embodiments have been described above. Those skilled in the art will understand, however, that changes and modifications may be made to the embodiments described without departing from the true scope and spirit of the present invention, which is defined by the claims.

We claim:

1. A power amplifier circuit, comprising:
    a plurality of stages, each stage comprising:
        a selection circuit configured to output a selection signal;
        a switch configured to (a) receive the selection signal from the selection circuit, (b) select an input signal based on the received selection signal, and (c) output the selected input signal; and
        a storage element, wherein the storage element has (a) a first terminal coupled to an output of the switch and (b) a second terminal configured to provide an output signal; and
    a combination circuit configured to provide a combined output signal by combining the output signal provided at the second terminal of each storage element in the plurality of stages.

2. The power amplifier circuit of claim 1, wherein the switch and the selection circuit are CMOS circuits.

3. The power amplifier circuit of claim 1, wherein the storage element is a capacitor.

4. The power amplifier circuit of claim 1, wherein the selection circuit is further configured to receive amplitude information corresponding to a reference signal, wherein the selection signal is based, at least in part, on the amplitude information.

5. The power amplifier circuit of claim 4, further comprising a reference circuit that is coupled to the selection circuit and configured to receive the reference signal.

6. The power amplifier circuit of claim 5, wherein the reference circuit is configured to convert a phase of the reference signal into non-overlapping clock signals.

7. The power amplifier circuit of claim 4, wherein the input signal comprises at least one of ground, a first voltage, or a second voltage.

8. The power amplifier circuit of claim 1, wherein the combined output signal comprises an approximate square wave having the same fundamental frequency as the reference signal.

9. The power amplifier circuit of claim 1, wherein the combination circuit is further configured to provide an amplitude of the combined output signal, the amplitude being proportional to the number of stages that are providing an output to the combination circuit at a given time.

10. The power amplifier circuit of claim 1, further comprising a bandpass matching circuit configured to (a) receive the combined output signal and (b) remove at least one frequency component of the combined output signal, and (c) substantially match an output impedance of the combination circuit to a subsequent input impedance.

11. A method for amplifying a signal, comprising:
receiving a selection signal at each switch from a set of switches;
each switch responsively (a) selecting a respective input signal based on the received selection signal and (b) outputting the selected respective input signal;
receiving, at a first terminal of each storage element from a set of storage elements, the selected respective input signal output by a respective switch;
providing, at a second terminal of each storage element from the set of storage elements, a respective output signal; and
combining the respective output signals provided at the second terminal of each storage element to create a combined output signal.

12. The method of amplifying a signal of claim 11, wherein each switch is a CMOS circuit.

13. The method of amplifying a signal of claim 11, wherein each storage device is a capacitor.

14. The method of amplifying a signal of claim 11, further comprising:
receiving, at a selection circuit, the selection signal that indicates amplitude information corresponding to a reference signal, wherein the selection signal is based, at least in part, on the amplitude information.

15. The method of amplifying a radio-frequency signal of claim 14, wherein the selection circuit is a CMOS circuit.

16. The method of amplifying a signal of claim 14, further comprising:
receiving, at a reference circuit, the reference signal; and
the reference circuit converting a phase associated with the reference signal into non-overlapping clock signals.

17. The method of amplifying a signal of claim 11, wherein the input signal comprises at least one of ground, a first voltage, or a second voltage.

18. The method of amplifying a signal claim 11, wherein the combined output signal comprises an approximate square wave that has a fundamental frequency equal to the fundamental frequency of the reference signal.

19. The method of amplifying a signal of claim 11, wherein the respective output signals are combined by a combination circuit, and wherein the combined output signal has an amplitude proportional to the number of storage elements that are providing an output to the combination circuit at a given time.

20. The method of amplifying a signal of claim 11, wherein the respective output signals are combined by a combination circuit, further comprising:
removing at least one frequency component from the combined output signal; and
substantially matching an output impedance of the combination circuit to a subsequent input impedance.

* * * * *